(12) United States Patent
Chuang

(10) Patent No.: US 6,483,178 B1
(45) Date of Patent: Nov. 19, 2002

(54) SEMICONDUCTOR DEVICE PACKAGE STRUCTURE

(75) Inventor: Jui-Yu Chuang, Taichung (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 09/616,729

(22) Filed: Jul. 14, 2000

(51) Int. Cl.⁷ .................. H01L 23/495; H01L 21/48
(52) U.S. Cl. .................. 257/672; 257/676; 257/684; 257/690; 257/692; 257/784; 257/787; 438/112; 438/123; 438/124; 438/127; 361/723; 361/773; 361/813
(58) Field of Search ............... 257/666, 669, 257/672, 674, 676, 684, 784, 787, 678, 690, 692, 698; 438/112, 123, 124, 127, 617, 111; 361/723, 772, 773, 776, 813

(56) References Cited

U.S. PATENT DOCUMENTS

| | | | | |
|---|---|---|---|---|
| 4,862,246 A | * | 8/1989 | Masuda et al. | 257/666 |
| 5,973,388 A | * | 10/1999 | Chew et al. | 257/676 |
| 6,143,981 A | * | 11/2000 | Glenn | 174/52.4 |
| 6,166,430 A | * | 12/2000 | Yamaguchi | 257/666 |
| 6,208,020 B1 | * | 3/2001 | Minamio et al. | 257/684 |
| 6,372,539 B1 | * | 4/2002 | Bayan et al. | 438/106 |
| 6,399,415 B1 | * | 6/2002 | Bayan et al. | 438/106 |

FOREIGN PATENT DOCUMENTS

| | | | |
|---|---|---|---|
| JP | 3-201545 | * | 9/1991 |
| JP | 5-109928 | * | 4/1993 |
| JP | 5-121622 | * | 5/1993 |
| JP | 6-21305 | * | 1/1994 |
| JP | 6-338583 | * | 12/1994 |
| JP | 11-145369 | * | 5/1999 |
| WO | WO 99/00826 | * | 1/1999 |

* cited by examiner

Primary Examiner—David L. Talbott
Assistant Examiner—Alonzo Chambliss
(74) Attorney, Agent, or Firm—Peter F. Corless; Steven M. Jensen; Edwards & Angell, LLP

(57) ABSTRACT

A semiconductor device package structure is proposed, which allows the encapsulation body to be highly secured in position to the leads, making the encapsulation body hardly delaminated from the leads. The proposed semiconductor device package structure comprises a die pad; a semiconductor chip mounted on the die pad; a plurality of leads arranged around the die pad, each lead being formed with a bolting hole; a plurality of bonding wires for electrically coupling the semiconductor chip to the leads; and an encapsulation body which encapsulates the semiconductor chip and the bonding wires and includes a part filled in the bolting hole in each of the leads. The bolting hole is characterized in the forming of a constricted middle part or an inclined orientation with respect to the lead surface, which allows the encapsulation body to be highly secured in position to the leads, thereby making the encapsulation body hardly delaminated from the leads. As a result, the finished package product can be highly assured in quality and reliability.

20 Claims, 2 Drawing Sheets

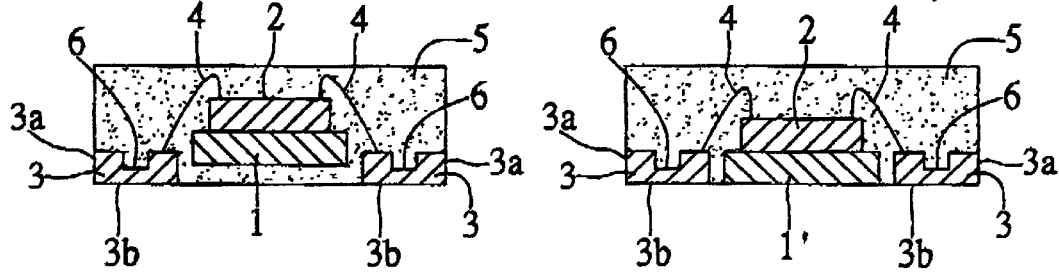
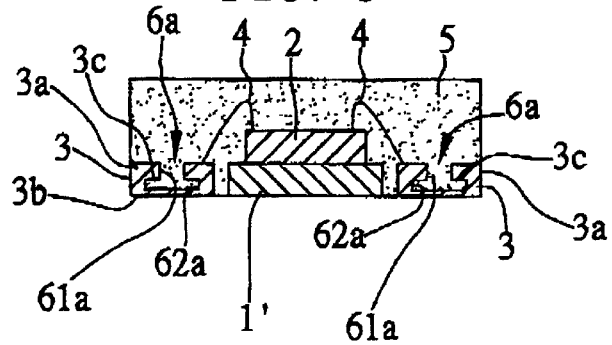
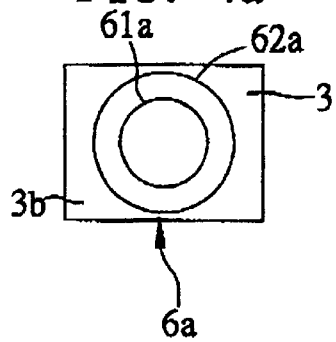
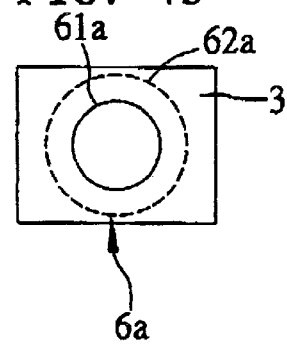
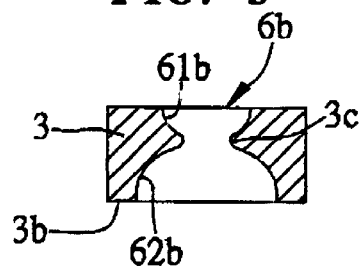
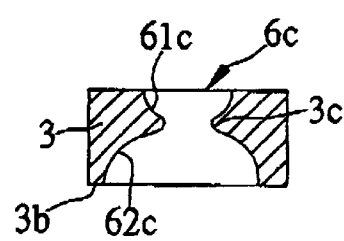

SEMICONDUCTOR DEVICE PACKAGE STRUCTURE

BACKGROUND OF THE INVENTION

1. Field of the Invention

This invention relates to semiconductor device packaging technology, and more particularly, to a semiconductor device package structure which allows the encapsulation body to be highly secured in position to the leads, making the encapsulation body hardly delaminated from the leads.

2. Description of Related Art

QFN (Qaud Flat Non-leaded) is an advanced semiconductor device packaging technology that allows a semiconductor device package to be made very compact in size. FIG. 1 is a schematic sectional diagram of a conventional QFN package structure. As shown, the QFN package structure includes a die pad 1; a semiconductor chip 2 mounted on the die pad 1; a lead portion 3 having a plurality of leads (only part is shown in the sectional view of FIG. 1) around the die pad 1; a set of bonding wires 4 for electrically coupling the semiconductor chip 2 to the lead portion 3; and an encapsulation body 5 which encapsulates the semiconductor chip 2 and the bonding wires 4 while exposing the outer part 3a and the bottom surface 3b of the lead portion 3. This QFN package structure differs from conventional QFP (Quad Flat Package) in that it uses the bottom surface 3b of the lead portion 3 for electrically bonding to printed circuit board (not shown) rather than using external pins. This benefit allows the QEN type of packages to be made smaller in size than the QFP type by about 60%. Moreover, the non-leaded design of the QFN package structure allows a more shortened signal transmission line than the QFP type, so that it allows a higher performance to the semiconductor chip enclosed therein.

FIG. 2 is a schematic sectional diagram of another conventional QFN package structure. As shown, this QFN package structure is characterized in that the bottom surface of the die pad 1' is exposed to the outside of the encapsulation body 5 for the purpose of providing the semiconductor chip 2 with a direct heat-dissipation path to the atmosphere.

One drawback to the forgoing two kinds of QFN package structures, however, is that since the lead portion 3 has its outer part 3a and the bottom surface 3b of the lead portion 3 exposed to the outside of the encapsulation body 5, the encapsulation body 5 would be easily delaminated from the lead portion 3. Moreover, during singulation process, the cutting force would even cause the lead portion 3 to break apart from the encapsulation body 5, which would adversely degrade the quality and reliability of the finished package product.

One solution to the foregoing problem is to form a bolting hole 6 in the upper surface of the lead portion 3, as illustrated in FIGS. 1 and 2, through, for example, etching. This allows the encapsulation body 5 to have one part filled in the bolting hole 6, thereby providing a bolting effect to the entire encapsulation body 5, making the encapsulation body 5 less likely to be delaminated from the lead portion 3.

One drawback to the forgoing solution, however, is that the resulted bolting effect is still unsatisfactory due to the reason that the lead portion 3 is very small in size so that it would not be able to provide really sufficient bonding strength to secure the encapsulation body 5 firmly in position.

SUMMARY OF THE INVENTION

It is therefore an objective of this invention to provide a new semiconductor device package structure which can help allow the encapsulation body to be highly secured to the lead portion so that it would be unlikely to be delaminated from the lead portion to allow the finished package product to be assured in quality and reliability.

In accordance with the foregoing and other objectives, the invention proposes a new semiconductor device package structure.

The semiconductor device package structure of the invention comprises a die pad; a semiconductor chip mounted on the die pad; a plurality of leads arranged around the die pad, each lead being formed with a bolting hole having a constricted middle part; a plurality of bonding wires for electrically coupling the semiconductor chip to the leads; and an encapsulation body which encapsulates the semiconductor chip and the bonding wires and includes a part filled in the bolting hole in each of the leads, while exposing an outer part and a bottom surface of each of the leads. The bolting hole has various embodiments that allow the encapsulation body to be highly secured in position to the lead portion, thereby making the encapsulation body hardly delaminated from the lead portion, allowing the finished package product to be highly assured in quality and reliability than the prior art.

BRIEF DESCRIPTION OF DRAWINGS

The invention can be more fully understood by reading the following detailed description of the preferred embodiments, with reference made to the accompanying drawings, wherein:

FIG. 1 (PRIOR ART) is a schematic sectional diagram of a conventional QFN package structure, FIG. 2 (PRIOR ART) is a schematic sectional diagram of another conventional QFN package structure;

FIG. 3 is a schematic sectional diagram of a first preferred embodiment of the semiconductor device package structure of the invention;

FIG. 4A is a schematic top view of the bolting hole formed in the lead portion of a die pad utilized in the semiconductor device package structure of FIG. 3;

FIG. 4B is a schematic bottom view of that of FIG. 4A;

FIG. 5 is a schematic sectional diagram of a second preferred embodiment of the semiconductor device package structure of the invention;

FIG. 6 is a schematic sectional diagram of a third preferred embodiment of the semiconductor device package structure of the invention;

DETAILED DESCRIPTION OF PREFERRED EMBODIMENTS

Figure 7:
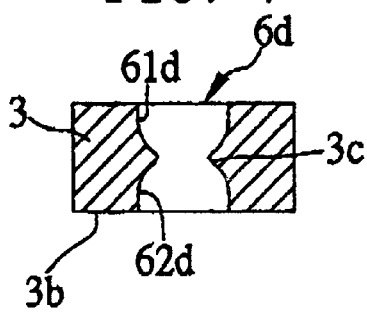
FIG. 7 is a schematic sectional diagram of a fourth preferred embodiment of the semiconductor device package structure of the invention.

In accordance with the invention, various preferred embodiments are disclosed in the following.

First Preferred Embodiment

The first preferred embodiment of the semiconductor device package structure of the invention is disclosed in the following with reference to FIG. 3 and FIGS. 4A–4B.

As shown, this embodiment includes a die pad 1; a semiconductor chip 2 mounted on the die pad 1; a lead portion 3 having a plurality of leads (only part is shown in the sectional view of FIG. 3) around the die pad 1; a set of bonding wires 4 for electrically coupling the semiconductor chip 2 to the lead portion 3; and an encapsulation body 5 which encapsulates the semiconductor chip 2 and the bonding wires 4 while exposing the outer part 3a and the bottom surface 3b of the lead portion 3. It is a characteristic feature of the invention that the lead portion 3 is formed with a specially-shaped bolting hole 6a having an upper portion 61a and a bottom portion 62a, with the upper portion 61a being constricted in dimension with respect to the bottom portion 62a. FIG. 4A is a schematic top view of the, bolting hole 6a, while FIG. 4B is a schematic bottom view of the same.

During encapsulation process, the encapsulation material used to form the encapsulation body 5 will also fill into the bolting hole 6a. After the encapsulation material is cured, the part filled into the bolting hole 6a will serve as bolting means that can firmly secure the encapsulation body 5 in position to the lead portion 3. Moreover, owing to the constricted upper portion 61a of the bolting hole 6a, the encapsulating material filled and cured in the bolting hole 6a would be hardly withdrawable. As a result, the encapsulation body 5 would be hardly delaminated from the lead portion 3.

Second Preferred Embodiment

FIG. 5 is a schematic sectional diagram of the second preferred embodiment of the semiconductor device package structure of the invention. As shown, in this embodiment, the bolting hole 6b is formed with an upper portion 61b and a bottom portion 62b, both being substantially hemispherically-shaped, and the upper portion 61b being smaller in diameter than the bottom portion 62b. Moreover, a constricted part 3c is formed at the border between the upper portion 61b and the bottom portion 62b, which is the narrowest part in the bolting hole 6b. Owing to the narrowed upper portion 61b and the constricted part 3c, the encapsulating material filled and cured in the bolting hole 6b would be hardly withdrawable. As a result, the encapsulation body 5 would be hardly delaminated from the lead portion 3.

Third Preferred Embodiment

FIG. 6 is a schematic sectional diagram of the third preferred embodiment of the semiconductor device package structure of the invention. In this embodiment, the bolting hole 6c is formed with an upper portion 61c and a bottom portion 62c, both being substantially hemispherically-shaped, and the upper portion 61c being smaller in diameter than the bottom portion 62c. Moreover, a constricted part 3c is formed at the border between the upper portion 61c and the bottom portion 62c which is the narrowest part in the bolting hole 6c. This embodiment differs from the previous second embodiment only in that the hemispherically-shaped upper portion 61c and the hemispherically-shaped bottom portion 62c are unaxially aligned. Owing to the narrowed upper portion 61c and the constricted part 3c, the bolting hole 6c would be hardly withdrawable. As a result, the encapsulation body 5 would be hardly delaminated from the lead portion 3.

Fourth Preferred Embodiment

FIG. 7 is a schematic sectional diagram of the fourth preferred embodiment of the semiconductor device package structure of the invention. As shown, in this embodiment, the bolting hole 6d is formed with an upper portion 61d and a bottom portion 62d, both being substantially hemispherially-shaped. Moreover, a constricted part 3c is formed at the border between the upper portion 61d and the bottom portion 62d, which is the narrowest part in the bolting hole 6d. This embodiment is substantially identical to the embodiment of FIG. 5 except that the upper portion 61d and the bottom portion 62d here are substantially equal in diameter. Owing to the constricted part 3c, the encapsulating material filled and cured in the bottom portion 62d would be hardly withdrawable from the bolting hole 6d. As a result, the encapsulation body 5 would be hardly delaminated from the lead portion 3.

Fifth Preferred Embodiment

Figure 8:
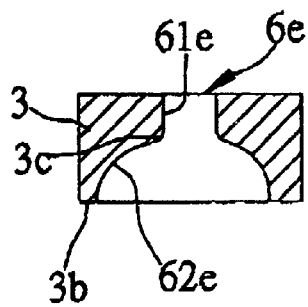
FIG. 8 is a schematic sectional diagram of a fifth preferred embodiment of the semiconductor device package structure of the invention.

FIG. 8 is a schematic sectional diagram of the fifth preferred embodiment of the semiconductor device package structure of the invention. As shown, in this embodiment, the bolting hole 6e is formed with an upper portion 61e and a bottom portion 62e, with the upper portion 61e being substantially cylindrically-shaped and the bottom portion 62e being substantially hemispherically-shaped, and the upper portion 61e being smaller in diameter than the bottom portion 62e. Moreover, a constricted part 3c is formed at the border between the upper portion 61e and the bottom portion 62e, which is the narrowest part in the bolting hole 6e. Owing to the narrowed upper portion 61e and the constricted part 3c, the encapsulating material filled and cured in the bolting hole 6e would be hardly withdrawable. As a result, the encapsulation body 5 would be hardly delaminated from the lead portion 3.

Sixth Preferred Embodiment

Figure 9A:
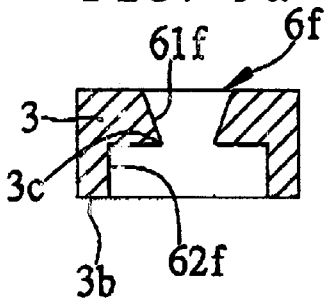
FIGS. 9A–9B are schematic sectional diagrams of a sixth preferred embodiment of the semiconductor device package structure of the invention.

FIG. 9A is a schematic sectional diagram of the sixth preferred embodiment of the semiconductor device package structure of the invention. As shown, in this embodiment, the bolting hole 6f is formed with an upper portion 61f and a bottom portion 62f, with the upper portion 61f being substantially inwardly-tapered and the bottom portion 62e being substantially cylindrically-shaped and dimensioned wider than the upper portion 61f. Moreover, a constricted part 3c is formed at the border between the upper portion 61f and the bottom portion 62f, which is the narrowest part in the bolting hole 6f. Owing to the inwardly-tapered upper portion 61e and the constricted part 3c, the encapsulating material filled and cured in the bolting hole 6f would be hardly withdrawable. As a result, the encapsulation body 5 would be hardly delaminated from the lead portion 3.

Figure 9B:
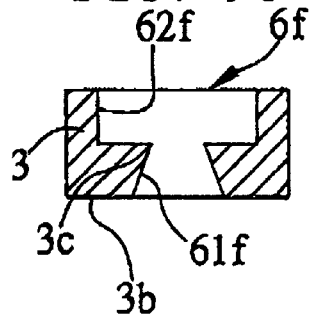

FIG. 9B shows an alteration to the embodiment of FIG. 9A, which shows that the cylindrically-shaped portion and the inwardly-taped portion are changed in position. Owing to the inwardly-tapered bottom portion 61f and the constricted part 3c, the encapsulating material filled and cured in the bolting hole 6f would be hardly withdrawable. As a result, the encapsulation body 5 would be hardly delaminated from the lead portion 3.

Seventh Preferred Embodiment

Figure 10:
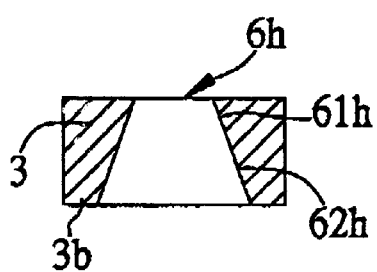
FIG. 10 is a schematic sectional diagram of a seventh preferred embodiment of the semiconductor device package structure of the invention.

FIG. 10 is a schematic sectional diagram of the seventh preferred embodiment of the semiconductor device package structure of the invention. As shown, in this embodiment, the bolting hole 6h is formed in an upwardly-tapered shape with a narrow upper part 61h and a wide bottom part 62h. Owing to the upwardly-tapered shape, the encapsulating material filled and cured in the bolting hole 6h would be hardly, withdrawable. As a result, the encapsulation body 5 would be hardly delaminated from the lead portion 3.

Eighth Preferred Embodiment

Figure 11:
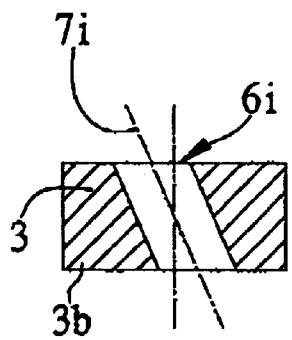
FIG. 11 is a schematic sectional diagram of an eighth preferred embodiment of the semiconductor device package structure of the invention.

FIG. 11 is a schematic sectional diagram of the eighth preferred embodiment of the semiconductor device package structure of the invention. As shown, in this embodiment, the bolting hole 6i is formed in an inclined cylindrical shape (i.e., the longitudinal axis 7i of the cylindrical shape is inclined with respect to the normal line perpendicular to the bottom surface 3b of the lead portion 3. Owing to the inclined structure, the encapsulating material filled and cured in the bolting hole 6i can be highly secured to the inner wall of the bolting hole 6i. As a result, the encapsulation body 5 would be hardly delaminated from the lead portion 3.

Ninth Preferred Embodiment

Figure 12:
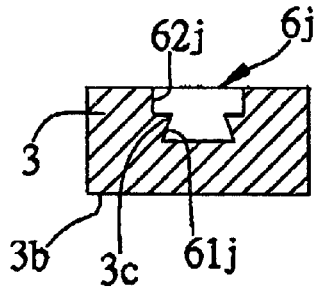
FIG. 12 is a schematic sectional diagram of a ninth preferred embodiment of the semiconductor device package structure of the invention.

FIG. 12 is a schematic sectional diagram of the ninth preferred embodiment of the semiconductor device package structure of the invention. As shown, in this embodiment, the bolting hole 6j is substantially identical in structure to the one shown in FIG. 9B, which also includes a cylindrically-shaped upper portion 62j and an inwardly-tapered bottom portion 61j and further includes a constricted part 3c at the border between the upper portion 61j and the bottom portion 62j, and which differs from the embodiment of FIG. 9B only in that the inwardly-tapered bottom portion 61j here is not through to the bottom surface 3b of the lead portion 3. Owing to the inwardly-tapered bottom portion 61j and the constricted part 3c, the encapsulating material filled and cured in the bolting hole 6j would be hardly withdrawable. As a result, the encapsulation body 5 would be hardly delaminated from the lead portion 3.

In conclusion, the invention provides a new semiconductor device package structure which is characterized in the forming of a bolting hole having a constricted middle part or an inclined orientation with respect to the lead surface, which allows the encapsulation body to be highly secured in position to the leads, thereby making the encapsulation body hardly delaminated from the leads. As a result, the finished package product can be highly assured in quality and reliability. In addition to the die-pad exposed type shown in FIG. 3, the invention can also be utilized on the die-pad encapsulated type shown in FIG. 1. Moreover, the bolting hole is not limited to the hemispherical shape or cylindrical shape disclosed above, and in addition can be rectangularly, squarely, elliptically, polygonally shaped in longitudinal cross section. The bolting hole can be formed through, for example, etching, punching, or drilling.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device package structure, which comprises:

a die pad;

a semiconductor chip mounted on the die pad;

a plurality of leads arranged around the die pad, each lead being formed with a bolting hole that includes an upper portion, a bottom portion, and a constricted middle portion formed at a border between the upper portion and the bottom portion, wherein the bolting hole does not penetrate through each lead;

a plurality of bonding wires for electrically coupling the semiconductor clip to the leads; and an encapsulation body which encapsulates the semiconductor chip and the bonding wires and includes a part filled in the bolting hole in each of the leads, while exposing an outer part and a bottom surface of each of the leads.

2. The semiconductor device package structure of claim 1, wherein the bolting hole includes a cylindrically-shaped upper portion and an upwardly-tapered bottom portion.

3. The semiconductor device package structure of claim 1, wherein the bolting hole includes a cylindrically-shaped upper portion and a cylindrically-shaped bottom portion, with the cylindrically-shaped bottom portion being wider in diameter than the cylindrically-shaped upper portion.

4. The semiconductor device package structure of claim 3, wherein the cylindrically-shaped upper portion and the cylindrically-shaped bottom portion are aligned in longitudinal axis to each other.

5. The semiconductor device package structure of claim 3, wherein the cylindrically-shaped upper portion and the cylindrically-shaped bottom portion are unaligned in longitudinal axis to each other.

6. The semiconductor device package structure of claim 1, wherein the bolting hole includes a hemispherically-shaped upper portion arid a hemispherically-shaped bottom portion, with the hemispherically-shaped bottom portion being wider in diameter than the hemispherically-shaped upper portion.

7. The semiconductor device package structure of claim 6, wherein the hemispherically-shaped upper portion and the hemispherically-shaped bottom portion are axially aligned to each other.

8. The semiconductor device package structure of claim 6, wherein the hemispherically-shaped upper portion and the hemispherically-shaped bottom portion are axially unaligned to each other.

9. The semiconductor device package structure of claim 1, wherein the bolting hole includes a hemispherically-shaped upper portion and a hemispherically-shaped bottom portion, with the hemispherically-shaped bottom portion being narrower in diameter than the hemispherically-shaped upper portion.

10. The semiconductor device package structure of claim 9, wherein the hemispherically-shaped upper portion and the hemispherically-shaped bottom portion are axially aligned to each other.

11. The semiconductor device package structure of claim 9, wherein the hemispherically-shaped upper portion and the hemispherically-shaped bottom portion are axially unaligned to each other.

12. The semiconductor device package structure of claim 1, wherein the bolting hole includes a hemispherically-shaped upper portion and a hemispherically-shaped bottom portion, with the hemispherically-shaped bottom portion being equal in diameter to the hemispherically-shaped upper portion.

13. The semiconductor device package structure of claim 12, wherein the hemispherically-shaped upper portion and the hemispherically-shaped bottom portion are axially aligned to each other.

14. The semiconductor device package structure of claim 12, wherein the hemispherically-shaped upper portion and the hemispherically-shaped bottom portion are axially unaligned to each other.

15. The semiconductor device package structure of claim 1, wherein the bolting hole includes a cylindrically-shaped upper portion and a hemispherically-shaped bottom portion, with the hemispherically-shaped bottom portion being greater in diameter than the cylindrically-shaped upper portion.

16. The semiconductor device package structure of claim 15, wherein the cylindrically-shaped upper portion and the hemispherically-shaped bottom portion are axially aligned to each other.

17. The semiconductor device package structure of claim 15, wherein the cylindrically-shaped upper portion and the hemispherically-shaped bottom portion are axially unaligned to each other.

18. The semiconductor device package structure of claim 1, wherein the bolting hole includes a downward-tapered upper portion and a cylindrically-shaped bottom portion.

19. The semiconductor device package structure of claim 1, wherein the bolting hole is formed in ail upwardly-tapered shape.

20. A semiconductor device package structure, which comprises:

a die pad;

a semiconductor chip mounted on the die pad;

a plurality of leads arranged around the die pad, each lead being formed with a bolting hole whose longitudinal axis is inclined by an acute angle with respect to the lead surface, wherein the bolting hole does not penetrate through each lead;

a plurality of bonding wires for electrically coupling the semiconductor chip to the leads; and an encapsulation body which encapsulates the semiconductor chip and the bonding wires and includes a part filled in the bolting hole in each of the leads, while exposing an outer part and a bottom surface of each of the leads.

* * * * *